US012684910B2

(12) United States Patent
Wuester et al.

(10) Patent No.: US 12,684,910 B2
(45) Date of Patent: Jul. 14, 2026

(54) METALLIC LAYER FOR DIMMING LIGHT-EMITTING DIODE CHIPS

(71) Applicant: CreeLED, Inc., Durham, NC (US)

(72) Inventors: Steven Wuester, Wake Forest, NC (US); Seth Joseph Balkey, Durham, NC (US); Colin Stuart, Durham, NC (US); Peter Andrews, Durham, NC (US)

(73) Assignee: CreeLED, Inc., Durham, NC (US)

( * ) Notice: Subject to any disclaimer, the term of this patent is extended or adjusted under 35 U.S.C. 154(b) by 562 days.

(21) Appl. No.: 17/889,922

(22) Filed: Aug. 17, 2022

(65) Prior Publication Data
US 2024/0063344 A1 Feb. 22, 2024

(51) Int. Cl.
*H10H 20/833* (2025.01)
*H10H 20/01* (2025.01)
*H10H 20/84* (2025.01)

(52) U.S. Cl.
CPC .......... *H10H 20/833* (2025.01); *H10H 20/01* (2025.01); *H10H 20/84* (2025.01)

(58) Field of Classification Search
CPC ...... H10H 20/833; H10H 20/01; H10H 20/84; H10H 20/034; H10H 20/819
USPC ............... 257/79, 98, 99; 438/28, 29, 38, 46
See application file for complete search history.

(56) References Cited

U.S. PATENT DOCUMENTS

| | | | |
|---|---|---|---|
| 8,686,429 B2 | 4/2014 | Bergmann et al. | |
| 9,461,201 B2 | 10/2016 | Heikman et al. | |

| | | | |
|---|---|---|---|
| 10,879,441 B2 | 12/2020 | Check | |
| 10,991,861 B2 | 4/2021 | Bergmann et al. | |
| 11,031,527 B2 | 6/2021 | Check | |
| 11,094,848 B2 | 8/2021 | Breva et al. | |
| 11,387,389 B2 | 7/2022 | Check et al. | |

(Continued)

FOREIGN PATENT DOCUMENTS

| | | |
|---|---|---|
| CN | 118661274 A | 9/2024 |
| JP | 2013239699 A | 11/2013 |

(Continued)

OTHER PUBLICATIONS

Preliminary Examination Report for Taiwanese Patent Application No. 112128845, mailed May 9, 2024, 17 pages.

(Continued)

*Primary Examiner* — Mounir S Amer
*Assistant Examiner* — Nicholas B Michaud
(74) *Attorney, Agent, or Firm* — Withrow & Terranova, P.L.L.C.

(57) ABSTRACT

Solid-state lighting devices including light-emitting diodes (LEDs) and a semi-transparent metallic layer deposited on an LED chip that can dim a light output of the LED chip are disclosed. The thickness of the semi-transparent metal layer can be adjusted based on the desired dimming level. In an embodiment, the metallic layer can be deposited on top of a passivation layer over the LED structure, so that the metallic layer is not electrically coupled to the LED. The metallic layer can additionally cover the mesa sidewalls of the LED structure. The metallic layer can be titanium, or platinum, or other suitable metals in other embodiments. In an embodiment, the metallic layer can be deposited on to the passivation layer, where a length of time the metallic layer is deposited, can be based on the amount of dimming desired.

20 Claims, 6 Drawing Sheets

(56)  References Cited

U.S. PATENT DOCUMENTS

| | | | |
|---|---|---|---|
| 2008/0121999 A1* | 5/2008 | Kawahara | H10D 84/83 |
| | | | 257/E29.264 |
| 2008/0138657 A1* | 6/2008 | Lee | H10K 59/871 |
| | | | 428/690 |
| 2015/0041836 A1 | 2/2015 | Saito et al. | |
| 2015/0090991 A1 | 4/2015 | Ishii et al. | |
| 2015/0349208 A1 | 12/2015 | Kim et al. | |
| 2016/0155902 A1* | 6/2016 | Lunev | H10H 20/835 |
| | | | 428/670 |
| 2017/0179350 A9* | 6/2017 | Mayer | H10H 20/856 |
| 2018/0130924 A1 | 5/2018 | Ko et al. | |
| 2018/0212110 A1 | 7/2018 | Chen et al. | |
| 2019/0067396 A1 | 2/2019 | Cheng et al. | |
| 2021/0143608 A1 | 5/2021 | Lee et al. | |
| 2023/0231077 A1* | 7/2023 | Niwa | H10H 20/01 |
| | | | 257/79 |
| 2023/0246137 A1* | 8/2023 | Zang | H10H 20/84 |
| | | | 257/79 |
| 2024/0145632 A1 | 5/2024 | Tseng et al. | |
| 2024/0395978 A1 | 11/2024 | Zhu et al. | |

FOREIGN PATENT DOCUMENTS

| | | | |
|---|---|---|---|
| TW | 200416812 | A | 9/2004 |
| TW | 200423218 | A | 11/2004 |
| TW | 201230407 | A | 7/2012 |
| TW | 1910452 | B | 1/2026 |
| WO | 2020188851 | A1 | 9/2020 |

OTHER PUBLICATIONS

Reasons for Rejection for Taiwanese Patent Application No. 11320467590, mailed Oct. 1, 2024, 13 pages.
International Search Report and Written Opinion for International Patent Application No. PCT/US2023/071172, mailed Nov. 13, 2023, 13 pages.
Examination Report for Taiwanese Patent Application No. 112128845, mailed Mar. 28, 2025, 23 pages.
Examination Report for Taiwanese Patent Application No. 114146926, mailed Jan. 14, 2026, 16 pages.
Notice of Reason for Rejection for Japanese Patent Application No. 2025-508859, mailed Mar. 3, 2026, 7 pages.

* cited by examiner

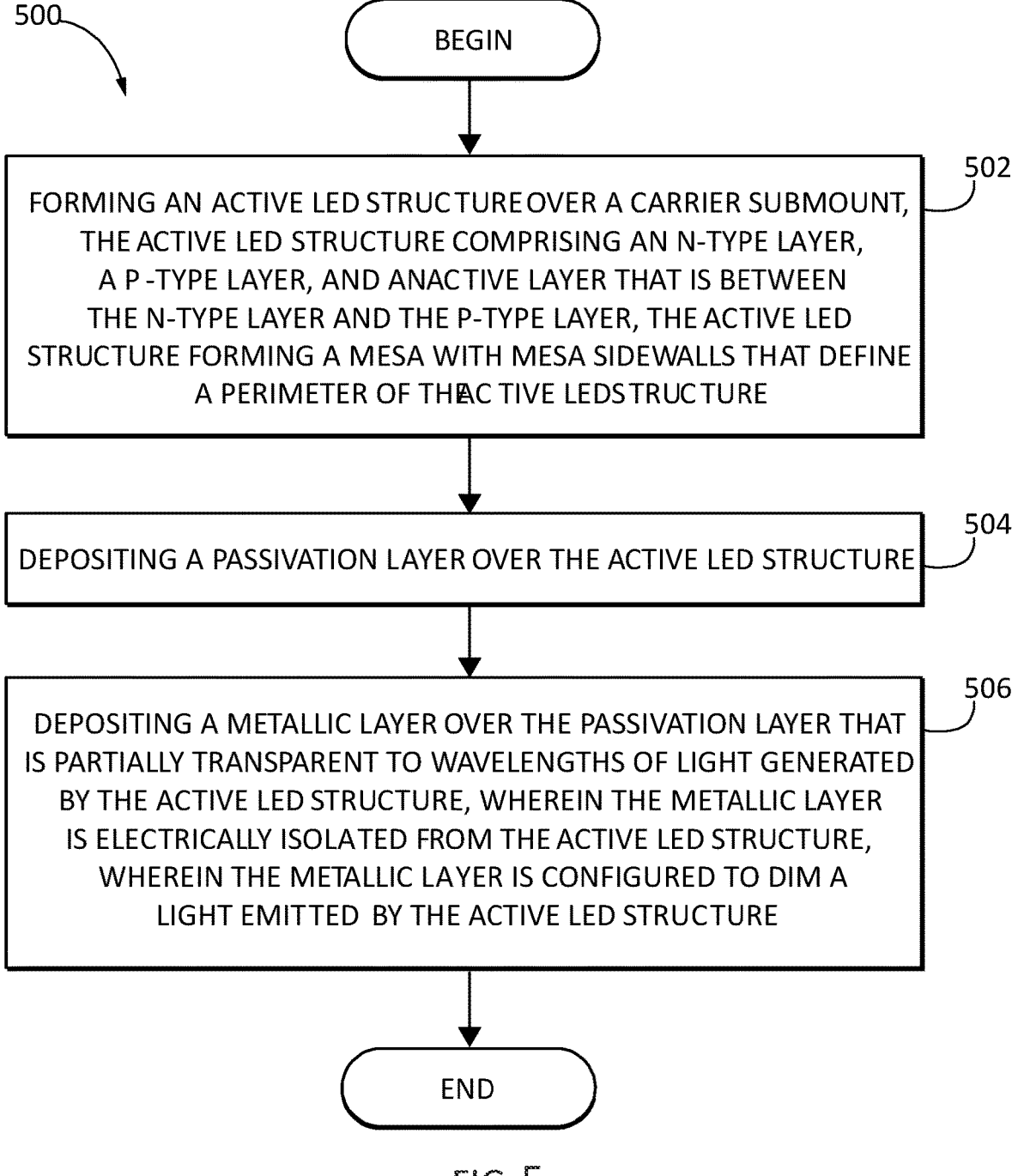

500

BEGIN

FORMING AN ACTIVE LED STRUCTURE OVER A CARRIER SUBMOUNT, THE ACTIVE LED STRUCTURE COMPRISING AN N-TYPE LAYER, A P-TYPE LAYER, AND AN ACTIVE LAYER THAT IS BETWEEN THE N-TYPE LAYER AND THE P-TYPE LAYER, THE ACTIVE LED STRUCTURE FORMING A MESA WITH MESA SIDEWALLS THAT DEFINE A PERIMETER OF THE ACTIVE LED STRUCTURE

502

DEPOSITING A PASSIVATION LAYER OVER THE ACTIVE LED STRUCTURE

504

DEPOSITING A METALLIC LAYER OVER THE PASSIVATION LAYER THAT IS PARTIALLY TRANSPARENT TO WAVELENGTHS OF LIGHT GENERATED BY THE ACTIVE LED STRUCTURE, WHEREIN THE METALLIC LAYER IS ELECTRICALLY ISOLATED FROM THE ACTIVE LED STRUCTURE, WHEREIN THE METALLIC LAYER IS CONFIGURED TO DIM A LIGHT EMITTED BY THE ACTIVE LED STRUCTURE

506

END

METALLIC LAYER FOR DIMMING LIGHT-EMITTING DIODE CHIPS

FIELD OF THE DISCLOSURE

The present disclosure relates to solid-state lighting devices including light-emitting diodes (LEDs) and more particularly to a metallic layer that dims light emitted by LED chips.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

As advancements in modern LED technology progress, the art continues to seek improved LEDs and solid-state lighting devices having desirable illumination characteristics capable of overcoming challenges associated with conventional devices.

SUMMARY

The present disclosure relates to solid-state lighting devices including light-emitting diodes (LEDs) and, more particularly, to a semi-transparent metallic layer deposited on an LED chip that can dim a light output of the LED chip. The thickness of the semi-transparent metal layer can be adjusted based on the desired dimming level. In an embodiment, the metallic layer can be deposited on top of a passivation layer over the LED structure, so that the metallic layer is not electrically coupled to the LED. The metallic layer can additionally cover the mesa sidewalls of the LED structure. The metallic layer can be titanium, or platinum, or other suitable metals in other embodiments. In an embodiment, the metallic layer can be sputter deposited on to the passivation layer, where a length of time the metallic layer is sputter deposited, can be based on the amount of dimming desired.

In one aspect, an LED chip comprises: an active LED structure comprising an n-type layer, a p-type layer, and an active layer that is between the n-type layer and the p-type layer, the active LED structure forming a mesa with mesa sidewalls that define a perimeter of the active LED structure; a metallic layer that is partially transparent to wavelengths of light generated by the active LED structure; and a passivation layer between the metallic layer and the active LED structure, so that the metallic layer is electrically isolated from the active LED structure.

In another aspect, an LED chip can include a carrier submount. The LED chip can also include an active LED structure bonded to the carrier submount, the active LED structure comprising an n-type layer, a p-type layer, and an active layer arranged between the n-type layer and the p-type layer, the active LED structure forming a mesa with mesa sidewalls that define a perimeter of the active LED structure. The LED chip can also include a metallic layer that is partially transparent to wavelengths of light generated by the active LED structure. The LED chip can also include a dielectric layer between the metallic layer and the active LED structure, so that the metallic layer is electrically isolated from the active LED structure.

In another aspect, a method for fabricating an LED chip is disclosed. The method includes forming an active LED structure over a carrier submount, the active LED structure comprising an n-type layer, a p-type layer, and an active layer that is between the n-type layer and the p-type layer, the active LED structure forming a mesa with mesa sidewalls that define a perimeter of the active LED structure. The method can also include depositing a passivation layer over the active LED structure. The method can also include depositing a metallic layer over the passivation layer that is partially transparent to wavelengths of light generated by the active LED structure, wherein the metallic layer is electrically isolated from the active LED structure, wherein the metallic layer dims a light emitted by the active LED structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 5 is a flowchart depicting a method for fabricating an LED chip with a metallic layer according to one or more embodiments of the present disclosure.

DETAILED DESCRIPTION

Figure 1:
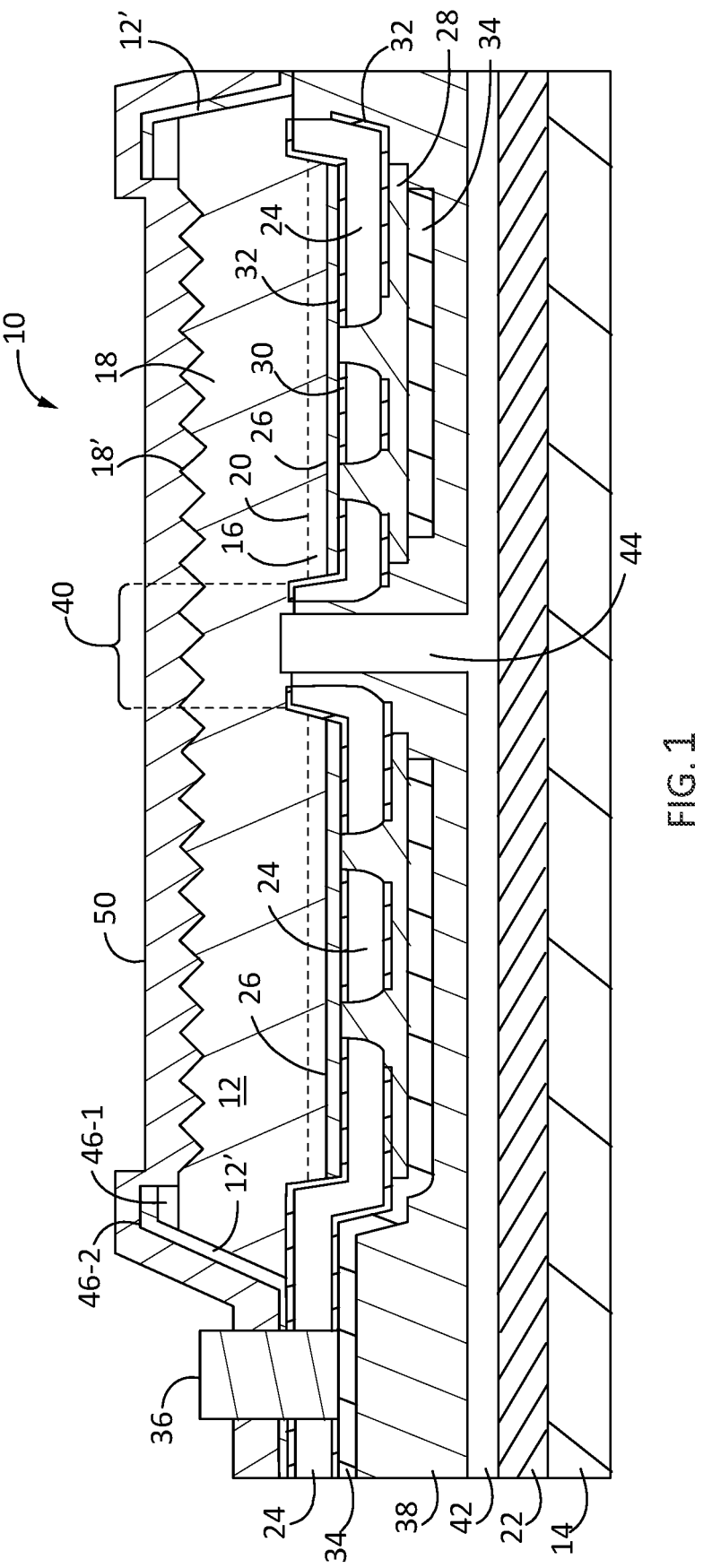
FIG. 1 is a generalized cross-section of a light-emitting diode (LED) chip that embodies a vertical chip structure according to one or more embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the present disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to a semi-transparent metallic layer deposited on an LED chip that can dim a light output of the LED chip. The thickness of the semi-transparent metal layer can be adjusted based on the desired dimming level. In an embodiment, the metallic layer can be deposited on top of a passivation layer over the LED structure, so that the metallic layer is not electrically coupled to the LED. The metallic layer can additionally cover the mesa sidewalls of the LED structure. The metallic layer can be titanium, or platinum, or other suitable metals in other embodiments. In an embodiment, the metallic layer can be sputter deposited on to the passivation layer, where a length of time the metallic layer is sputter deposited, can be based on the amount of dimming desired.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group Ill nitride-based material systems. Group Ill nitrides refer to those semiconductor compounds formed between nitrogen (N) and the elements in Group Ill of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may emit light with a peak wavelength in any area of the visible spectrum, for example peak wavelengths primarily in a range from 400 nm to 700 nm.

In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip may typically travel in a variety of directions. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, such as vertical geometry. A vertical geometry LED chip typically includes anode and cathode connections on opposing sides or faces of the LED chip. In certain embodiments, a vertical geometry LED chip may also include a growth substrate that is arranged between the anode and cathode connections. In certain embodiments, LED chip structures may include a carrier submount and where the growth substrate is removed. In still further embodiments, any of the principles described may also be applicable to flip-chip structures where anode and cathode connections are made from a same side of the LED chip for flip-chip mounting to another surface.

Aspects of the present relate to solid-state lighting devices including light-emitting diodes (LEDs) and more particularly to a semi-transparent metallic layer deposited on an LED chip that can dim a light output of the LED chip. The metallic layer can be semi-transparent to wavelengths of light emitted by the LED chip. Standard sapphire alternatives struggle to meet binning requirements as the brightness is often too high. The present disclosure provides a solution, as an existing chip platform can include a titanium or other metal layer in place of etching passivation and texturing in order to provide chips with a range of brightnesses using the same chip platform. The thickness of the metal layer can be modified to provide different dimming levels, thus allowing a single LED chip platform to meet a variety of brightness requirements. Titanium or platinum metal layers can be used since the metal layer adheres well to the passivation layers, and it can withstand gold etchants while still possessing light blocking capabilities.

FIG. 1 is a generalized cross-section of an LED chip 10 that embodies a vertical chip structure according to principles of the present disclosure. The LED chip 10 includes an active LED structure 12 formed on a carrier submount 14. The active LED structure 12 generally refers to portions of the LED chip 10 that include semiconductor layers, such as epitaxial semiconductor layers, that form a structure that generates light when electrically activated. The active LED structure 12 is formed on and supported by the carrier submount 14 that can be made of many different materials, with a suitable material being silicon, or doped silicon. In certain embodiments, the carrier submount 14 comprises an electrically conductive material such that the carrier submount 14 is part of electrically conductive connections to the active LED structure 12. The active LED structure 12 may generally comprise a p-type layer 16, an n-type layer 18, and an active layer 20 arranged between the p-type layer 16 and the n-type layer 18. The active LED structure 12 may include many additional layers such as, but not limited to, buffer layers, nucleation layers, super lattice structures, un-doped layers, cladding layers, contact layers, current-spreading layers, and light extraction layers and elements. Additionally, the active layer 20 may comprise a single quantum well, a multiple quantum well, a double hetero-structure, or super lattice structures. In FIG. 1, the p-type layer 16 is arranged between the active layer 20 and the carrier submount 14 such that the p-type layer 16 is closer to the carrier submount 14 than the n-type layer 18. The active LED structure 12 may initially be formed by epitaxially growing or depositing the n-type layer 18, the active layer 20, and the p-type layer 16 sequentially on a growth substrate. The active LED structure 12 may then be flipped and bonded to the carrier submount 14 by way of one or more bond metals 22 and the growth substrate is removed. In this manner, a top surface 18' of the n-type layer 18 forms a primary light extracting face of the LED chip 10. In certain embodiments, the top surface 18' may comprise a textured or patterned surface for improving light extraction. In other embodiments, the doping order may be reversed such that the n-type layer 18 is arranged between the active layer 20 and the carrier submount 14. In an embodiment, an outer layer 50 applied over top surface 18' of the n-type layer 18 to cover and protect the top surface 18'. In an embodiment, the outer layer 50 can be a neutral dielectric material such as SiN, $SiO_2$, or $Al_2O_3$ or other suitable passivating materials.

The LED chip 10 may include a first reflective layer 24 provided on the p-type layer 16. In certain embodiments, a current spreading layer 26 may be provided between the p-type layer 16 and the first reflective layer 24. The current spreading layer 26 may include a thin layer of a transparent conductive oxide such as indium tin oxide (ITO) or a thin metal layer such as Platinum (Pt), although other materials may be used. The first reflective layer 24 may comprise many different materials and preferably comprises a material that presents an index of refraction step with the material of the active LED structure 12 to promote total internal reflection (TIR) of light generated from the active LED structure 12. Light that experiences TIR is redirected without experiencing absorption or loss and can thereby contribute to useful or desired LED chip emission. In certain embodiments, the first reflective layer 24 comprises a material with an index of refraction lower than the index of refraction of the active LED structure 12 material. The first reflective layer 24 may comprise many different materials, with some having an index of refraction less than 2.3, while others can have an index of refraction less than 2.15, less than 2.0, and less than 1.5. In certain embodiments, the first reflective layer 24 comprises a dielectric material, such as silicon dioxide ($SiO_2$) and/or silicon nitride (SiN). It is understood that many dielectric materials can be used such as SiN, $SiN_x$, Si$_3$N$_4$, Si, germanium (Ge), SiO$_2$, SiOx, titanium dioxide (TiO$_2$), tantalum pentoxide (Ta$_2$O$_5$), ITO, magnesium oxide (MgOx), zinc oxide (ZnO), and combinations thereof. In certain embodiments, the first reflective layer 24 may include multiple alternating layers of different dielectric materials, e.g., alternating layers of SiO$_2$ and SiN that symmetrically repeat or are asymmetrically arranged. Some Group III nitride materials such as GaN can have an index of refraction of approximately 2.4, and SiO$_2$ can have an index of refraction of approximately 1.48, and SiN can have an index of refraction of approximately 1.9. Embodiments with the active LED structure 12 comprising GaN and the first reflective layer 24 comprising SiO$_2$ may form a sufficient index of refraction step between the two to allow for efficient TIR of light. The first reflective layer 24 may have different thicknesses depending on the type of materials used, with some embodiments having a thickness of at least 0.2 microns (μm). In some embodiments, the first reflective layer 24 can have a thickness in the range of 0.2 μm to 0.7 μm, while in some embodiments the thickness can be approximately 0.5 μm.

The LED chip 10 may further include a second reflective layer 28 that is on the first reflective layer 24 such that the first reflective layer 24 is arranged between the active LED structure 12 and the second reflective layer 28. The second reflective layer 28 may include a metal layer that is configured to reflect light from the active LED structure 12 that may pass through the first reflective layer 24. The second reflective layer 28 may comprise many different materials such as Ag, gold (Au), Al, nickel (Ni), titanium (Ti) or combinations thereof. The second reflective layer 28 may have different thicknesses depending on the type of materials used, with some embodiments having a thickness of at least 0.1 μm, or in a range including 0.1 μm to 0.7 μm, or in a range including 0.1 um to 0.5 um, or in a range including 0.1 μm to 0.3 μm. As illustrated, the second reflective layer 28 may include or form one or more reflective layer interconnects 30 that provide an electrically conductive path through the first reflective layer 24. In this manner, the one or more reflective layer interconnects 30 may extend through an entire thickness of the first reflective layer 24. In certain embodiments, the second reflective layer 28 is a metal reflective layer and the reflective layer interconnects 30 comprise reflective layer metal vias. Accordingly, the first reflective layer 24, the second reflective layer 28, and the reflective layer interconnects 30 form a reflective structure of the LED chip 10 that is on the p-type layer 16. As such, the reflective structure may comprise a dielectric reflective layer and a metal reflective layer as disclosed herein. In certain embodiments, the reflective layer interconnects 30 comprise the same material as the second reflective layer 28 and are formed at the same time as the second reflective layer 28. In other embodiments, the reflective layer interconnects 30 may comprise a different material than the second reflective layer 28. Certain embodiments may also comprise an adhesion layer 32 that is positioned at one or more interfaces between the first reflective layer 24 and the second reflective layer 28 and/or interfaces between the first reflective layer 24 and the current spreading layer 26 to promote improved adhesion therebetween. Many different materials can be used for the adhesion layer 32, such as titanium oxide (TiO, TiO$_2$), titanium oxynitride (TiON, Ti$_x$O$_y$N), tantalum oxide (TaO, Ta$_2$O$_5$), tantalum oxynitride (TaON), aluminum oxide (AlO, Al$_x$O$_y$) or combinations thereof, with a preferred material being TiON, AlO, or AlxOy. In certain embodiments, the adhesion layer comprises Al$_x$O$_y$, where 1≤x≤4 and 1≤y≤6. In certain embodiments, the adhesion layer comprises Al$_x$O$_y$, where x=2 and y=3, or Al$_2$O$_3$. The adhesion layer 32 may be deposited by electron beam deposition that may provide a smooth, dense, and continuous layer without notable variations in surface morphology. The adhesion layer 32 may also be deposited by sputtering, chemical vapor deposition, or plasma enhanced chemical vapor deposition.

The LED chip 10 may also comprise a barrier layer 34 on the second reflective layer 28 to prevent migration of material of the second reflective layer 28, such as Ag, to other layers. Preventing this migration helps the LED chip 10 maintain efficient operation throughout its lifetime. The barrier layer 34 may comprise an electrically conductive material, with suitable materials including but not limited Ti, Pt, Ni, Au, tungsten (W), and combinations or alloys thereof. In certain embodiments, the barrier layer 34 is arranged to laterally extend beyond portions of the active LED structure 12, or a peripheral border of the active LED structure 12 in order to provide an electrical connection with a p-contact 36. In this regard, an electrical path between the p-contact 36 and the p-type layer 16 may include the barrier layer 34, the second reflective layer 28, and the reflective layer interconnects 30. In other embodiments, the polarity may be reversed such that the p-contact 36 is replaced with an n-contact that is electrically coupled to the n-type layer 18 and electrical connections to the p-type layer 16 are made through the carrier submount 14. A passivation layer 38 is included on the barrier layer 34 as well as any portions of the second reflective layer 28 that may be uncovered by the barrier layer 34. The passivation layer 38 protects and provides electrical insulation for the LED chip 10 and can comprise many different materials, such as a dielectric material including but not limited to silicon nitride. In certain embodiments, the passivation layer 38 is a single layer, and in other embodiments, the passivation layer 38 comprises a plurality of layers. In certain embodiments, the passivation layer 38 may include one or more metal-containing interlayers arranged or embedded therein that may function as a crack stop layer for any cracks that may propagate through the passivation layer 38 as well as an additional light reflective layer.

In FIG. 1, the active LED structure 12 forms a first opening 40 or recess that extends through the p-type layer 16, the active layer 20, and a portion of the n-type layer 18. The first opening 40 may be formed by a subtractive material process, such as etching, that is applied to the active LED structure 12 before bonding with the carrier submount 14. As used herein, the first opening may also be referred to as an active LED structure opening. As illustrated, a portion of the first reflective layer 24, and adhesion layer 32, is arranged to cover sidewall surfaces of the p-type layer 16, the active layer 20, and the n-type layer 18 within the first opening 40. The passivation layer 38 extends along the first reflective layer 24 in the first opening 40 and is arranged on a surface of the n-type layer 18. The LED chip 10 further includes an n-contact metal layer 42 that is arranged on the passivation layer 38 and across the LED chip 10. At the first opening 40, the n-contact metal layer 42 extends into the first opening 40 to form an n-contact interconnect 44, which may be referred to as an n-contact via. In this manner, the first opening 40 may be defined where portions of the n-contact metal layer 42, the n-contact interconnect 44, the passivation layer 38, and the first reflective layer 24 extend into the active LED structure 12. As such, the n-contact metal layer 42 and the n-contact interconnect 44 may be integrally formed to provide an electrical connection to the n-type layer 18 through the first opening 40. In other embodiments, the n-contact metal layer 42 and the n-contact interconnect 44 may be separately formed and may comprise the same or different materials. In certain embodiments, the n-contact metal layer 42 and the n-contact interconnect 44 comprise a single layer or a plurality of layers that include conductive metals, such as one or more of Al, Ti, and alloys thereof.

As illustrated, the p-contact 36 may be formed on the barrier layer 34, and one or more top passivation layers 46-1, 46-2 may be provided on one or more top or side surfaces of the n-type layer 18 for additional electrical insulation. In FIG. 1, the top passivation layer 46-2 is arranged to cover mesa sidewalls 12' of the active LED structure 12. The top passivation layers 46-1, 46-2 may comprise separate layers of a continuous layer of dielectric material, such as silicon nitride. During fabrication of the mesa for the active LED structure 12, an etching step is applied to the active LED structure 12 from the n-type layer 18. The etching step effectively forms the mesa sidewalls 12' with sloped surfaces along the perimeter of the active LED structure 12.

Figure 2:
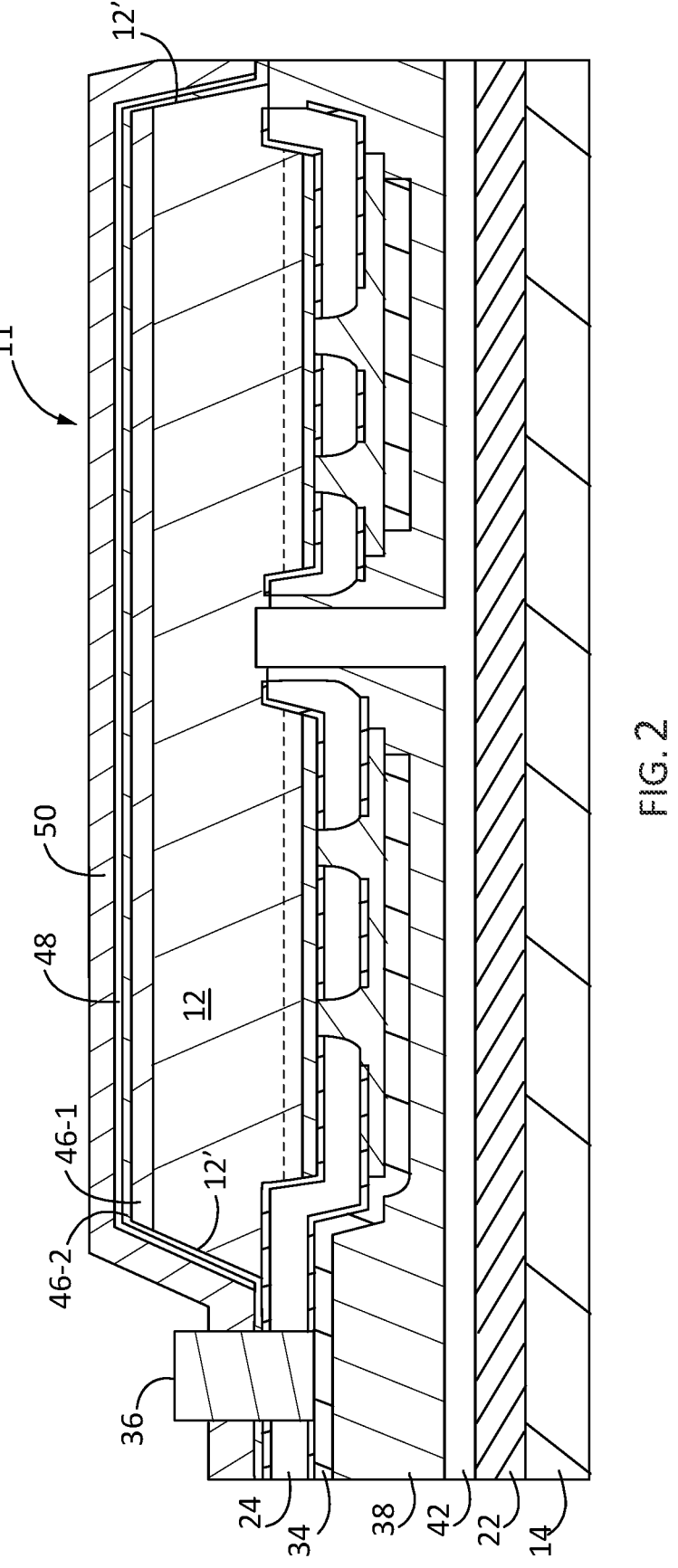
FIG. 2 is a cross-section of an LED chip that is similar to the LED chip of FIG. 1 and further includes a metallic layer that dims light emitted by the LED chip according to one or more embodiments of the present disclosure.

FIG. 2 is a cross-section of an LED chip 11 that is similar to the LED chip 10 of FIG. 1 and further includes a metallic layer 48 that dims light emitted by the LED chip 11 according to one or more embodiments of the present disclosure.

In FIG. 1, the LED chip 10 has the top passivation layers 46-1 and 46-2 etched away to expose n-type layer 18. The n-type layer is then textured such that the top surface 18' has improved light extraction. In the embodiment in FIG. 2 however, the LED chip 11 does not have the passivation layers 46-1 and 46-2 etched, and instead has an additional metallic layer 48 deposited on top of the passivation layer 46-2. Without texturing, the light emitted by the LED chip 11 is reduced to a first degree, and then the metallic layer 48, which can be semi-transparent, or partially opaque, can further reduce the light emitted by the LED chip 11, and more particularly, the light emitted by active LED structure 12. The metallic layer 48 may be arranged to reduce amounts of light generated by the active LED structure 12 that escape the LED chip 11 by absorbing and/or internally reflecting portions of light from the active LED structure 12. The metallic layer 48 can also cover the mesa sidewalls 12'. In some embodiments, the metallic layer 48 can have varying thicknesses, with a first thickness over the top of the active LED structure 12, and a second thickness over the mesa sidewalls 12'. The thicknesses of the metallic layer 48 over the active LED structure 12 and the mesa sidewalls 12' can be selected based on a desired emission pattern or to make adjustments to the overall dimming level of the metallic layer 48. In other embodiments, the metallic layer 48 can have a uniform thickness.

In an embodiment, the metallic layer 48 is at least one of titanium or platinum, which are metals which adhere well to the passivation layer 46-2 as well as having the ability to withstand gold etchants. The thickness of the metallic layer 48 can be adjusted based on the desired light emission from the LED chip 11. A thicker metallic layer 48 will reduce or dim the light emitted by the LED chip 11 more than a thin metallic layer 48.

In an embodiment, the metallic layer 48 can be deposited over the passivation layer 46-2 via sputter deposition or other form of physical vapor deposition such as cathodic arc deposition, electron-beam physical vapor deposition, evaporative deposition, close-space sublimation, pulsed laser deposition, or pulsed electron deposition. A length of time of the deposition process can determine the thickness of the metallic layer 48, given a known deposition rate.

In an embodiment, due to the passivation layers 46-1 and 46-2, which are a dielectric material (e.g., silicon nitride, etc), the metallic layer 48 is electrically insulated from, or not electrically coupled to the active LED structure 12.

In an embodiment, the metallic layer 48 can be patterned via a photomask in order to ensure the metallic layer 48 is not present in streets and pad areas of the LED chip 11. By ensuring that the metallic layer 48 is not present in the streets and pad areas of the LED chip 11, the metallic layer 48 can be electrically isolated from the active LED structure 12 and other components of the LED chip 11. The metallic layer 48 can also be patterned and have variable thicknesses across the top of the LED chip 11 in order to have a tunable brightness, tunable emission pattern, and/or tunable emitter shape. In an embodiment, the metallic layer 48 could be deposited over a photoresist layer which after the photomask is applied, results in a patterned metallic layer 48.

In an embodiment, the metallic layer 48 can have an outer layer 50 applied over the metallic layer to cover and protect the metallic layer 48. In an embodiment, the outer layer 50 can be a neutral dielectric material such as SiN, $SiO_2$, or $Al_2O_3$ or other suitable passivating materials.

As illustrated, the outer layer 50 may cover the metallic layer 48 along the sidewalls 12' and laterally extend past the metallic layer 48 to electrically isolate the p-contact 36 from the metallic layer 48. Accordingly, the metallic layer 48 may be effectively embedded or surrounded by the dielectric materials of the passivation layers 46-1 and 46-2 and the outer layer 50 such that the metallic layer 48 is electrically isolated from the active LED structure 12. By covering the metallic layer 48 with the outer layer 50, the metallic layer 48 may be electrically and environmentally isolated from additional layers that may be added to the LED chip 11 and/or a surrounding environment of the LED chip 11.

Figure 3:
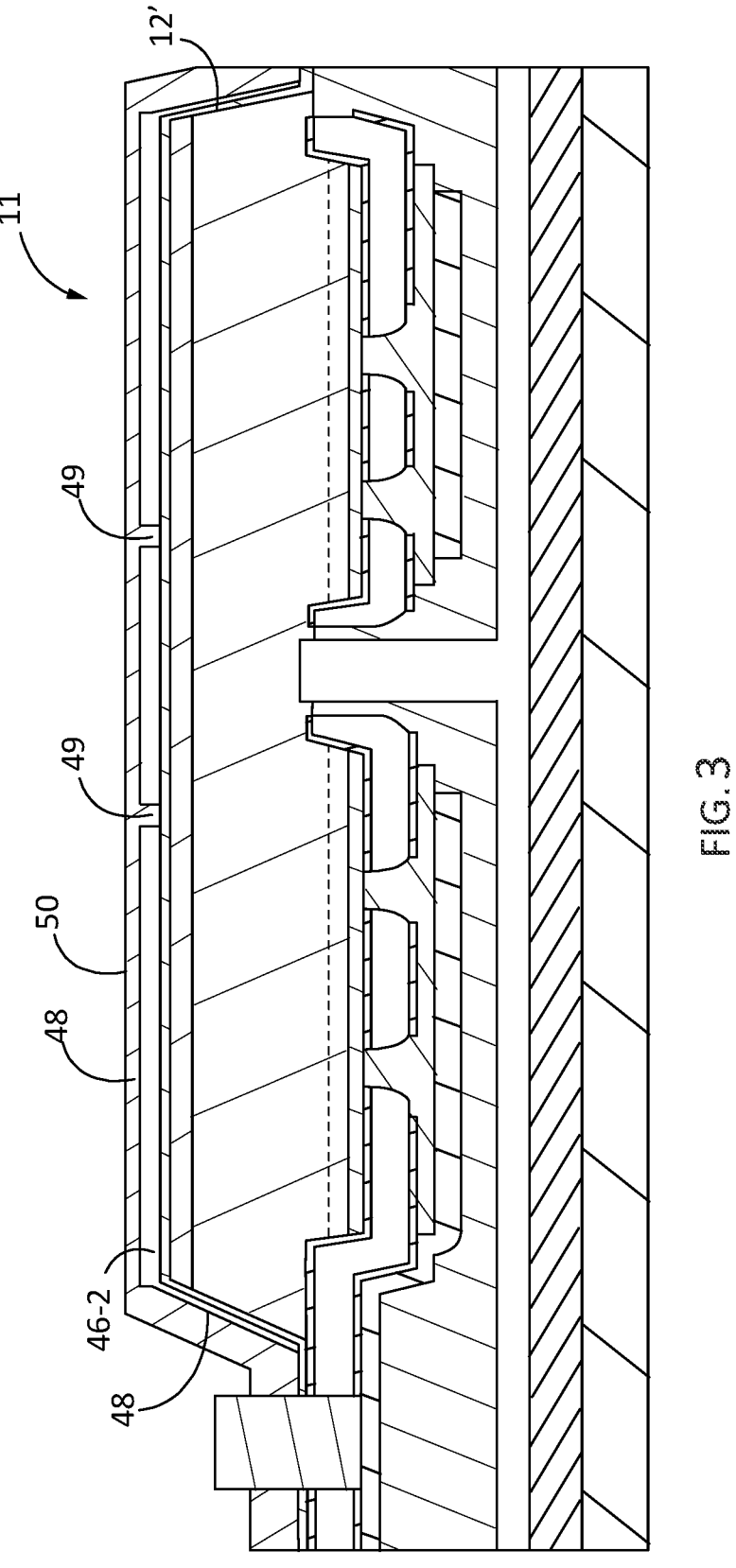
FIG. 3 is a cross-section of an LED chip that is a different embodiment of the LED chip depicted in FIG. 2 according to one or more embodiments of the present disclosure

Turning now to FIG. 3, illustrated is another embodiment of the LED chip 11 where the metallic layer 48 over the mesa sidewalls 12' can be a different thickness than the metallic layer 48 over the top surface of the active LED structure 12. For example, as shown in FIG. 3, the metallic layer 48 over the top surface of LED chip 11 is thicker than the metallic layer 48 over the mesa sidewalls 12'. Additionally, in the embodiment shown in FIG. 3, the metallic layer 48 can have openings 49 where a photomask was applied to create a pattern. The top layer 50 can fill in the openings 49 where there is no metallic layer 48.

Figure 4A:
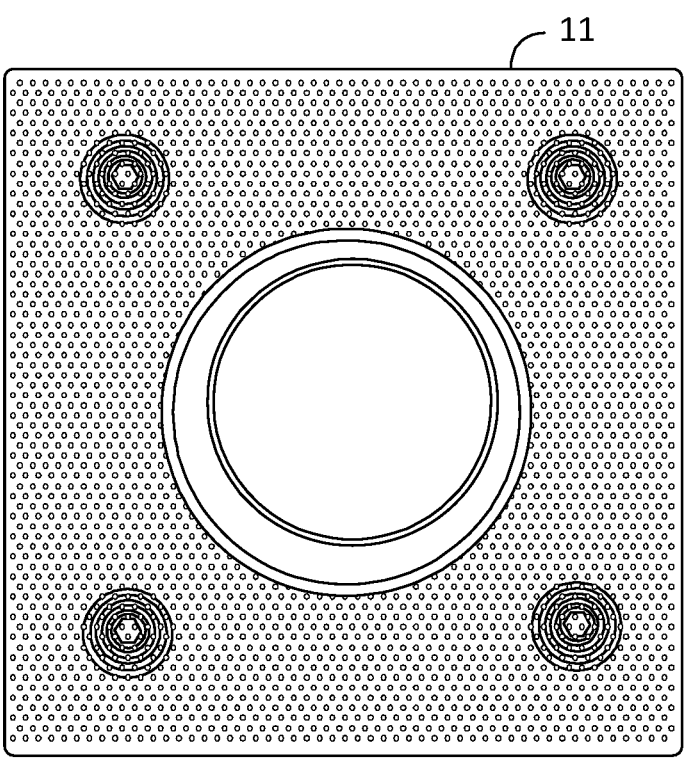
FIG. 4A is a top view of an LED chip without a metallic layer according to one or more embodiments of the present disclosure.
Figure 4B:
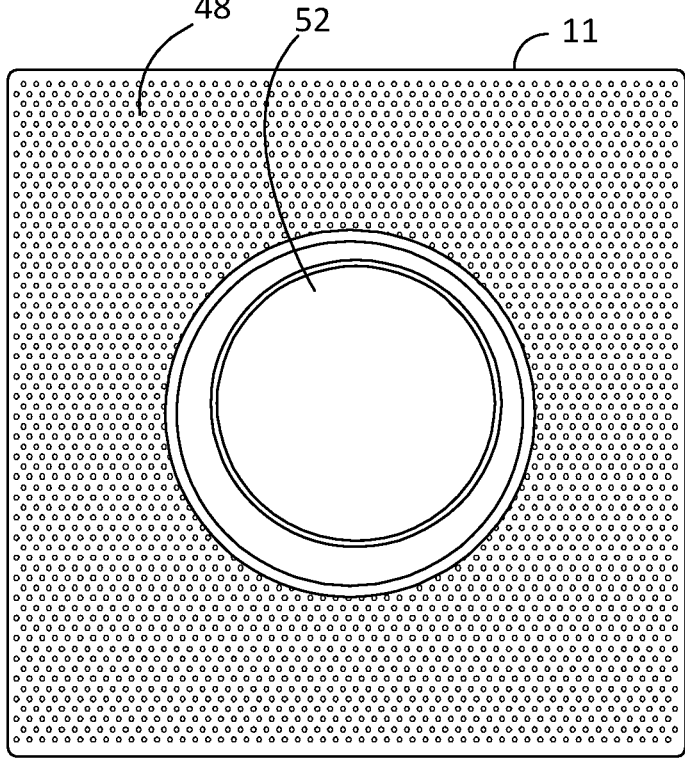
FIG. 4B is a top view of an LED chip with a metallic layer according to one or more embodiments of the present disclosure.

Turning now to FIGS. 4A and 4B, illustrated are a top view of an LED chip (e.g., LED chip 11) without a metallic layer (FIG. 4A) and with a metallic layer 48 (FIG. 4B) according to one or more embodiments of the present disclosure. In an embodiment, as shown in FIG. 4B, the metallic layer 48 can be patterned to include an opening 52 to prevent the metallic layer 48 from covering a pad or street area on the top of the LED chip 11.

Turning now to FIG. 5, illustrated is a flowchart depicting a method 500 for fabricating an LED chip 11 with a metallic layer 48 according to one or more embodiments of the present disclosure.

The method 500 can start at step 502, where the method includes forming an active LED structure 12 over a carrier submount 14, the active LED structure 12 comprising an n-type layer 18, a p-type layer 16, and an active layer that is between the n-type layer 18 and the p-type layer 16, the active LED structure 12 forming a mesa with mesa sidewalls 12' that define a perimeter of the active LED structure 12.

At step 504, the method can include depositing a passivation layer 46 over the active LED structure 12. In an embodiment, the passivation layer 46 can be a dielectric, such as silicon nitride.

At step 506, the method can include depositing a metallic layer 48 over the passivation layer 46-2 that is partially transparent to wavelengths of light generated by the active LED structure 12 wherein the metallic layer 48 is electrically isolated from the active LED structure 12, wherein the metallic layer 48 dims a light emitted by the active LED structure 12. In an embodiment, the metallic layer 48 can be deposited via sputter deposition, where the length of time depositing the metallic layer 48 controls the thickness of the metallic layer 48, which in turn controls the amount of dimming provided by the metallic layer 48. In other embodiments, other deposition techniques are possible as well, such as chemical vapor deposition, or plasma enhanced chemical vapor deposition. The metallic layer 48 can also be deposited in a predetermined pattern, or over a photoresist layer that once a photomask is applied, results in a patterned metallic layer 48.

Figure 6:
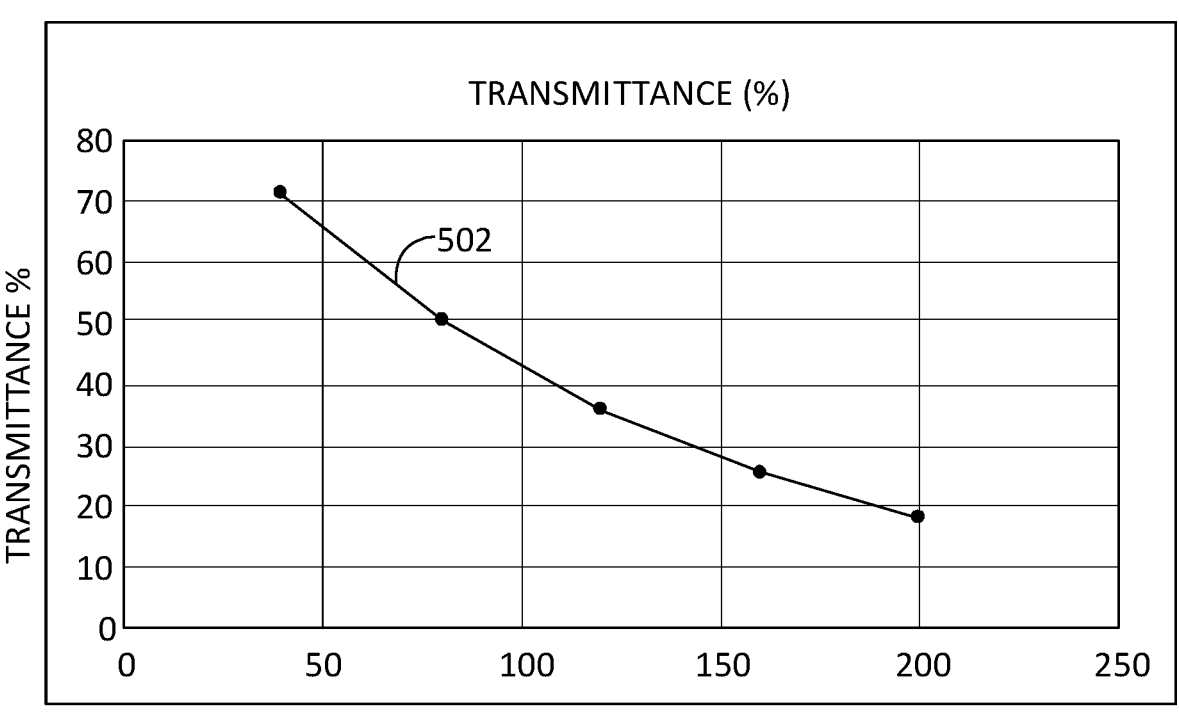
FIG. 6 is a graph depicting experimental results showing light transmittance as a function of thickness of the metallic layer according to one or more embodiments of the present disclosure.

Turning now to FIG. 6, illustrated is a graph depicting experimental results showing light transmittance as a function of thickness of the metallic layer according to one or more embodiments of the present disclosure The graph 600 depicts an experimental result 602 showing transmission percentage as a function of thickness of the metallic layer 48. In this example, the metallic layer 48 is titanium, and the light emitted is at 451 nm. The thickness is in Angstroms. The table that the graph 600 is based on is provided below in Table 1:

| Thickness (A) | Transmittance % |
|---|---|
| 40 | 71.261 |
| 80 | 50.782 |
| 120 | 36.188 |
| 160 | 25.788 |
| 200 | 18.377 |

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:
an active LED structure comprising an n-type layer, a p-type layer, and an active layer that is between the n-type layer and the p-type layer, the active LED structure forming a mesa with mesa sidewalls that define a perimeter of the active LED structure;
an electrical connection to the n-type layer from a first side of the active LED structure;
a metallic layer that is partially transparent to wavelengths of light generated by the active LED structure, wherein the metallic layer is on a second side of the active LED structure that is opposite the first side, and wherein the metallic layer is patterned to not cover a street or pad region of the LED chip; and a passivation layer between the metallic layer and the active LED structure, so that the metallic layer is electrically isolated from the active LED structure.

2. The LED chip of claim 1, wherein the mesa sidewalls are covered by the passivation layer and the metallic layer.

3. The LED chip of claim 1, wherein the metallic layer is configured to dim light emitted by the active LED structure.

4. The LED chip of claim 3, wherein an amount of light dimmed by the metallic layer corresponds to a thickness of the metallic layer.

5. The LED chip of claim 1, wherein the metallic layer is at least one of titanium or platinum.

6. The LED chip of claim 1, wherein the metallic layer is sputter deposited onto the passivation layer.

7. The LED chip of claim 1, wherein the metallic layer is patterned with a predefined pattern.

8. The LED chip of claim 1, wherein a first thickness of the metallic layer over a top of the active LED structure is different from a second thickness of the metallic layer over the mesa sidewalls of the active LED structure.

9. A light-emitting diode (LED) chip, comprising:
a carrier submount;
an active LED structure bonded to the carrier submount, the active LED structure comprising an n-type layer, a p-type layer, and an active layer arranged between the n-type layer and the p-type layer, the active LED structure forming a mesa with mesa sidewalls that define a perimeter of the active LED structure;
a metallic layer that is partially transparent to wavelengths of light generated by the active LED structure, wherein the metallic layer is on an opposite side of the active LED structure than the carrier submount, and wherein the metallic layer is patterned to not cover a street or pad region of the LED chip; and
a dielectric layer between the metallic layer and the active LED structure, so that the metallic layer is electrically isolated from the active LED structure.

10. The LED chip of claim 9, wherein the mesa sidewalls are covered by the dielectric layer and the metallic layer.

11. The LED chip of claim 9, wherein the metallic layer is configured to dim light emitted by the active LED structure.

12. The LED chip of claim 11, wherein an amount of light dimmed by the metallic layer corresponds to a thickness of the metallic layer.

13. The LED chip of claim 9, wherein the metallic layer is at least one of titanium or platinum.

14. The LED chip of claim 9, wherein the metallic layer is sputter deposited onto the dielectric layer.

15. The LED chip of claim 9, wherein the metallic layer is patterned with a predefined pattern.

16. The LED chip of claim 9, wherein the dielectric layer is silicon nitride.

17. The LED chip of claim 9, wherein a first thickness of the metallic layer over a top of the active LED structure is different from a second thickness of the metallic layer over the mesa sidewalls of the active LED structure.

18. A method for fabricating a light-emitting diode (LED) chip, comprising:
forming an active LED structure over a carrier submount, the active LED structure comprising an n-type layer, a p-type layer, and an active layer that is between the n-type layer and the p-type layer, the active LED structure forming a mesa with mesa sidewalls that define a perimeter of the active LED structure;
depositing a passivation layer over the active LED structure; and depositing a metallic layer over the passivation layer that is partially transparent to wavelengths of light generated by the active LED structure, wherein the metallic layer is electrically isolated from the active LED structure, wherein the metallic layer is configured to dim a light emitted by the active LED structure, and wherein the metallic layer is patterned to not cover a street or pad region of the LED chip.

19. The method of claim 18, further comprising:

depositing the metallic layer to a predetermined thickness based on a predetermined dimming level.

20. The method of claim 18, further comprising:

depositing the metallic layer in a predetermined pattern corresponding to an emission pattern.

* * * * *